(12) United States Patent
Sato

(10) Patent No.: US 6,788,127 B2
(45) Date of Patent: Sep. 7, 2004

(54) CIRCUIT FOR VARIABLY DELAYING DATA

(75) Inventor: Norihiko Sato, Chiba (JP)

(73) Assignee: Tektronix International Sales GmbH, Schaffhausen (CH)

( * ) Notice: Subject to any disclaimer, the term of this patent is extended or adjusted under 35 U.S.C. 154(b) by 0 days.

(21) Appl. No.: 10/447,498

(22) Filed: May 28, 2003

(65) Prior Publication Data

US 2004/0004505 A1 Jan. 8, 2004

(30) Foreign Application Priority Data

Jul. 5, 2002 (JP) ........................................ 2002-196619

(51) Int. Cl.$^7$ .............................................. H03K 17/62
(52) U.S. Cl. ........................ 327/407; 327/298; 341/101
(58) Field of Search ................................. 327/403, 404, 327/407, 408, 298; 341/100, 101

(56) References Cited

U.S. PATENT DOCUMENTS

| | | | |
|---|---|---|---|
| 5,247,652 A | * | 9/1993 | Uda .............................. 710/71 |
| 5,349,612 A | * | 9/1994 | Guo et al. ................... 375/371 |
| 5,726,651 A | * | 3/1998 | Belot .......................... 341/101 |
| 5,808,571 A | * | 9/1998 | Kuwata et al. ............. 341/100 |
| 6,031,473 A | * | 2/2000 | Kubinec ..................... 341/100 |
| 6,677,793 B1 | * | 1/2004 | Chan et al. ................. 327/158 |

* cited by examiner

Primary Examiner—Minh Nguyen
(74) Attorney, Agent, or Firm—Francis I. Gray

(57) ABSTRACT

A circuit for variably delaying a serial digital data signal delays a parallel data clock rather than the serial digital data signal directly. A delay circuit receives the parallel data clock to provide a delayed parallel data clock, the delay being a function of a control signal. A phase-locked loop receives the delayed parallel data clock to generate a serial data clock in phase with the delayed parallel data clock. A parallel-to-serial converter reads an n-bit parallel digital data signal from a memory using the delayed parallel data clock, and converts the parallel digital data signal to the serial digital data signal using the serial data clock. By changing the control signal continuously, the delay of the delayed parallel data clock and of the serial digital data signal also changes continuously so the serial digital data signal appears to have jitter.

14 Claims, 4 Drawing Sheets

CIRCUIT FOR VARIABLY DELAYING DATA

BACKGROUND OF THE INVENTION

The present invention relates to digital circuits, and more particularly to a data delay circuit for arbitrarily controlling a delay for a serial digital data signal.

A digital circuit generally has many blocks coupled together and, when a digital data signal is sent from one block to the next block, it is sometimes necessary to delay the digital data signal by a given amount. Japanese Patent Publication No. H06-177722 (unexamined) discloses an example of such delay technology. A serial-to-parallel shift register converts a serial digital data signal into a four-bit parallel digital data signal, each bit being provided to a separate one of four shift registers respectively. The clock speed of each shift register can be one fourth of a master clock speed so that inexpensive ones are used. Each of the four shift registers has eight delay outputs. A multiplexer is provided for each of the four shift registers so that there are four multiplexers in total. The multiplexers are controlled to select the same delay output from the four shift registers at the same time. Which delay output of the shift registers the corresponding multiplexers select determines the delay amount of the digital data. A parallel-to-serial shift register converts the digital data from the four multiplexers into a serial digital data signal that is delayed relative to the original serial digital data signal by a given time determined by the multiplexers.

Japanese Patent Publication No. 08-129878 (examined) also discloses similar technology. It converts a serial digital data signal into a parallel digital data signal, each bit of which is delayed, and the delayed bits are converted into a serial digital data signal again to achieve the desired serial digital data signal delay.

All of the above-described prior art produce a delayed serial digital data signal that is synchronized with the same clock as that of the original serial digital data signal, this clock being called a master clock or a system clock. This is because the serial digital data signal is expected to maintain the same timing in the next block of the digital circuit. The technology disclosed in the above Japanese Patent Publication No. 08-129878 is typically used for television signal processing in such products as a frame synchronizer, etc.

There are other applications in which the delay of the serial digital data signal is not an integral multiple of the master clock cycle or is not synchronized with the master clock. One example is the generation of a test digital data signal for use in jitter tolerance testing the digital circuit. In jitter tolerance testing the test digital data signal in which jitter is intentionally introduced is provided to a circuit under test to determine how much jitter is acceptable for proper operation of the circuit under test. The digital data signal for jitter tolerance testing may be produced by delaying a normal digital data signal that is usually provided to the circuit under test. But the jittered digital data signal is not necessarily synchronized with the master clock.

What is desired is a data delay circuit that is useful for delaying a serial digital data signal that is not necessarily synchronized with a master clock, that is simple, and that allows continual (analog-like) change of the delay amount of the serial digital data signal to produce a serial digital data signal that includes jitter.

BRIEF SUMMARY OF THE INVENTION

Accordingly the present invention provides a data delay circuit that produces a serial digital data signal with an arbitrary amount of delay when it converts a parallel digital data signal into the serial digital data signal. The parallel digital data signal may be supplied directly from a memory or from the conversion of a serial digital data signal via a serial-to-parallel converter. The data delay circuit may include a voltage controlled delay device that changes a delay amount continuously according to a control signal. The data delay circuit receives a parallel data clock and provides a delayed parallel data clock according to the control signal. A parallel-to-serial converter converts the parallel digital data signal into the serial digital data signal using the delayed parallel data clock. A control means provides the control signal to the data delay circuit to control the amount of delay for the serial digital data signal. The parallel-to-serial converter may have a phase-locked clock generator. The phase-locked clock generator produces a serial data clock having a frequency that is an integer multiple of the parallel data clock frequency, the integer multiple corresponding to the number of bits per word of the parallel digital data signal. The phase of the serial data clock is locked to that of the delayed parallel data clock. The data delay circuit may further have a data buffer that temporally stores the parallel digital data signal when a serial-to-parallel converter is used as a means for providing the parallel digital data signal from an input serial digital data signal. The data buffer also may be used if a memory is used as the parallel digital data signal source. The control signal provided to the data delay circuit may not be constant and may change continuously like a sine wave, for example, to allow the delay of the serial digital data signal to also change continuously to produce a serial digital data signal that includes jitter.

The objects, advantages and other novel features of the present invention are apparent from the following detailed description when read in conjunction with the appended claims and attached drawing.

DETAILED DESCRIPTION OF THE INVENTION

Figure 1:
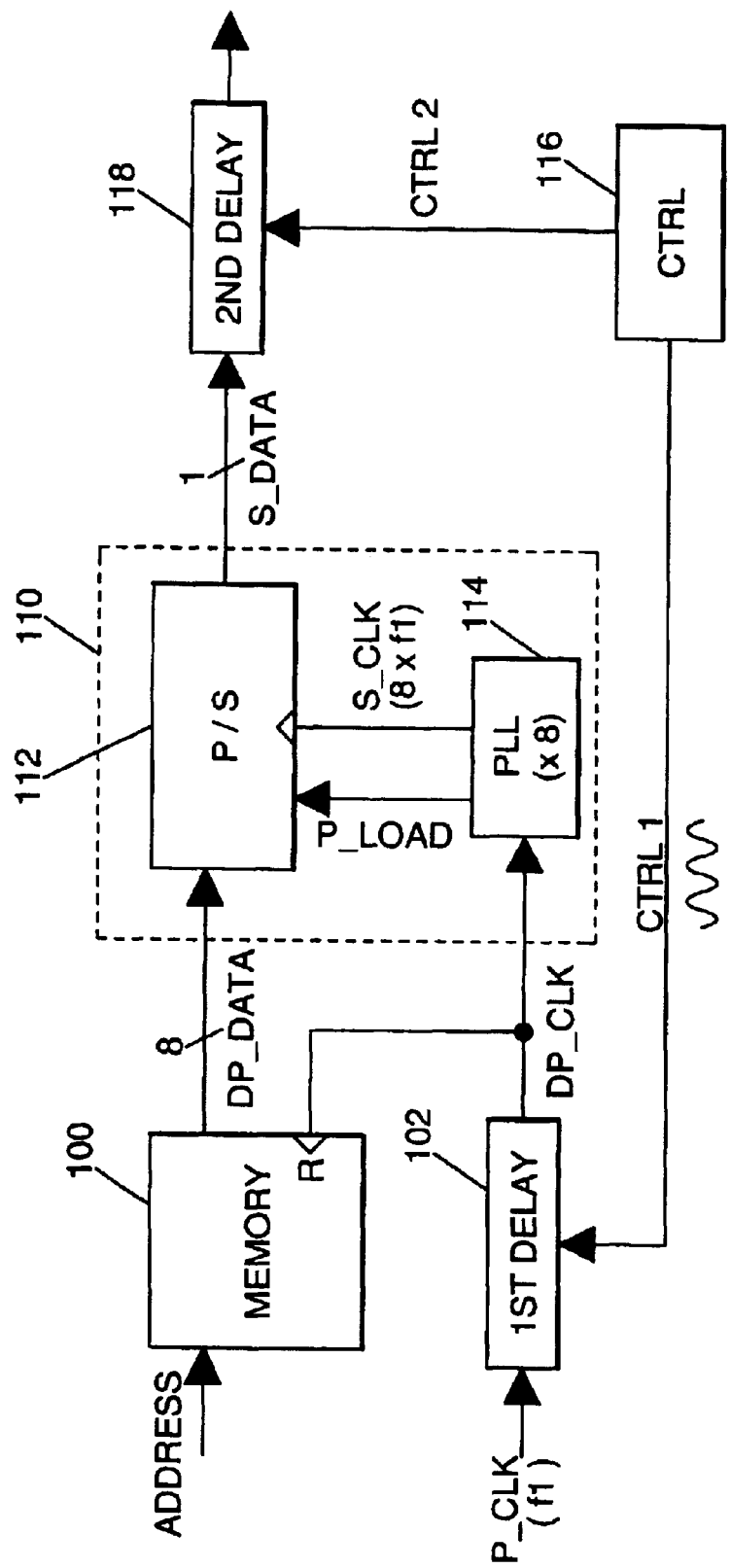
FIG. 1 is a block diagram view of a data delay circuit according to a first embodiment of the present invention.

Referring now to FIG. 1 a memory 100 stores a parallel digital data signal. A parallel-to-serial (P/S) converter 112 in a conversion block 110 converts the parallel digital data signal from the memory 100 into a serial digital data signal. A suitable conversion block 110 is available as an IC package and is well known in the art. This embodiment shows an example where each word of the parallel digital data signal is eight bits, but any number of bits per word may be used. A first delay circuit 102 is typically a voltage controlled delay device and delays an input digital signal according to a first control signal (CTRL 1). If the voltage of the first control signal CTRL 1 changes continuously, the delay amount also changes continuously. The first delay circuit 102 receives and delays a parallel data clock P_CLK to provide a delayed parallel data clock DP_CLK.

A signal source of the parallel data clock is not shown since any known clock generating means may be used to generate it. An example of parallel data clock generation is the extraction of a master clock component from the serial digital data of a digital television signal, which master clock component is divided according to the number of bits per word to produce the parallel data clock P_CLK.

The memory 100 receives the delayed parallel data clock DP_CLK at a read terminal R which determines the read timing of a delayed parallel digital data signal DP_DATA from the memory. The delayed parallel data clock DP_CLK also is provided to a phase-lock loop circuit 114 in the conversion block 110 to produce a serial data clock S_CLK that is phase locked to the delayed parallel data clock DP_CLK and has a frequency that is, for this example, eight times as high as the frequency of DP_CLK. The PLL 114 also produces a parallel data load signal P_LOAD phase locked to the delayed parallel data clock DP_CLK. The delayed parallel data DP_DATA is loaded into the parallel-to-serial converter 112 in response to the parallel data load signal P_LOAD. The parallel data load signal P_LOAD has the same frequency as the delayed parallel data clock DP_CLK, but the phase is adjusted to be delayed slightly relative to the DP_CLK so that the parallel-to-serial converter 112 can load the delayed parallel data DP_DATA read from the memory 100 in response to the delayed parallel data clock DP_CLK. The parallel-to-serial converter 112 provides a serial digital data signal S_DATA according to the serial data clock S_CLK.

A second delay circuit 118 may provide additional delay to the serial digital data signal S_DATA if necessary. The second delay circuit 118 also may be a voltage controlled delay device that delays the input serial digital data signal according to a second control signal CTRL 2. Similar to the above, if the voltage of the second control signal CTRL 2 changes continuously, the delay amount applied to S_DATA also changes continuously.

A control circuit 116, such as a microprocessor etc., provides the first and second control signals CTRL 1 and CTRL 2 to the first delay circuit 102 and the second delay circuit 118, respectively, for controlling the respective delays.

Presently a voltage controlled delay device that has a lower input frequency range also has a larger delay capability. The frequency of the delayed parallel data clock DP_CLK that the first delay circuit 102 receives is, for this example, about eight times slower on average than the speed of the serial digital data signal S_DATA that the second delay circuit 118 receives. Therefore, the first delay circuit 102 may be a voltage controlled delay device that has a larger delay than that used for the second delay circuit 118. Accordingly, the first delay circuit 102 applies a larger delay to P_CLK than the second delay circuit 118 does to S_DATA.

Figure 2:
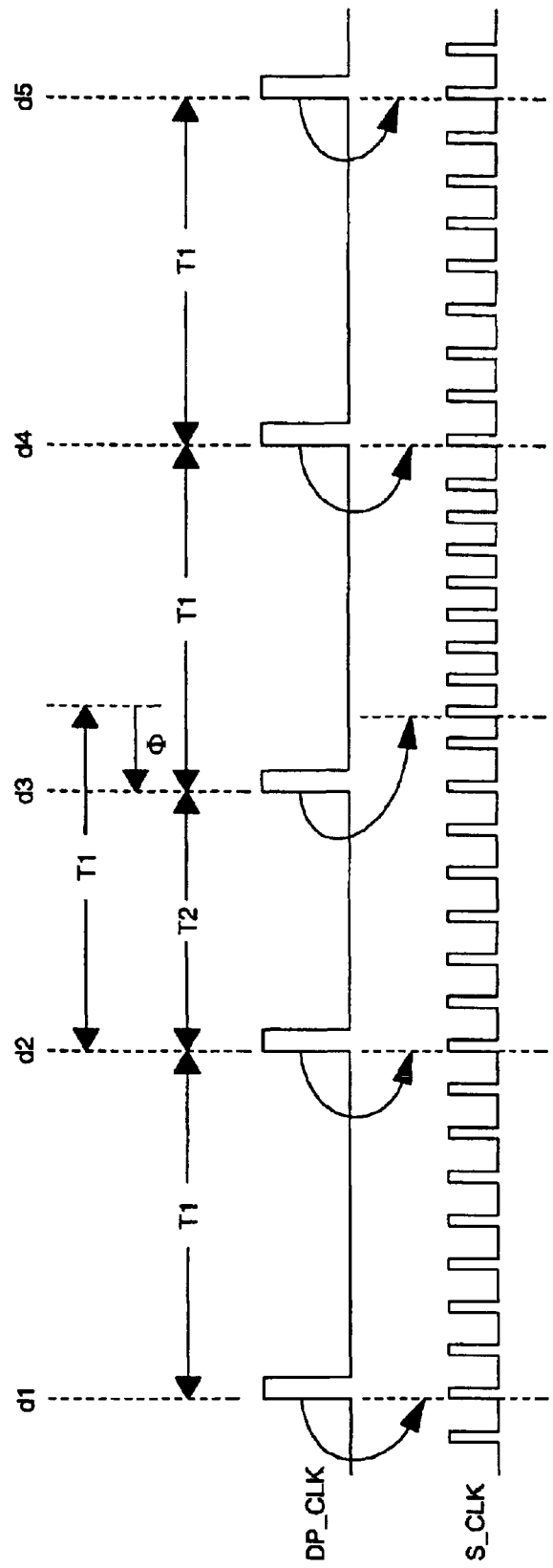
FIG. 2 is a timing chart view of a delayed parallel data clock and a serial data clock for a data delay circuit according to the present invention.

Referring to FIG. 2 a period of the delayed parallel data clock DP_CLK is T1 at first and the serial data clock S_CLK is phase-locked to the delayed parallel data clock DP_CLK. In this example there are eight cycles of the serial data clock S_CLK during one period of the delayed parallel data clock DP_CLK. At time d3 the delay amount of the first delay circuit 102 is changed so that the delayed parallel data clock DP_CLK advances in phase by Φ, and the period of the delayed parallel data clock DP_CLK is changed to be T2. Therefore, the leading edge of the serial data clock S_CLK is delayed relative to the corresponding leading edge of the delayed parallel data clock DP_CLK at the time d3. This controls the voltage-controlled oscillator (not shown) in the PLL 114 to shorten the periods of the serial data clock S_CLK so that the leading edge of the serial data clock S_CLK at time d4 meets the corresponding leading edge of delayed parallel data clock DP_CLK after time T1.

Figure 3:
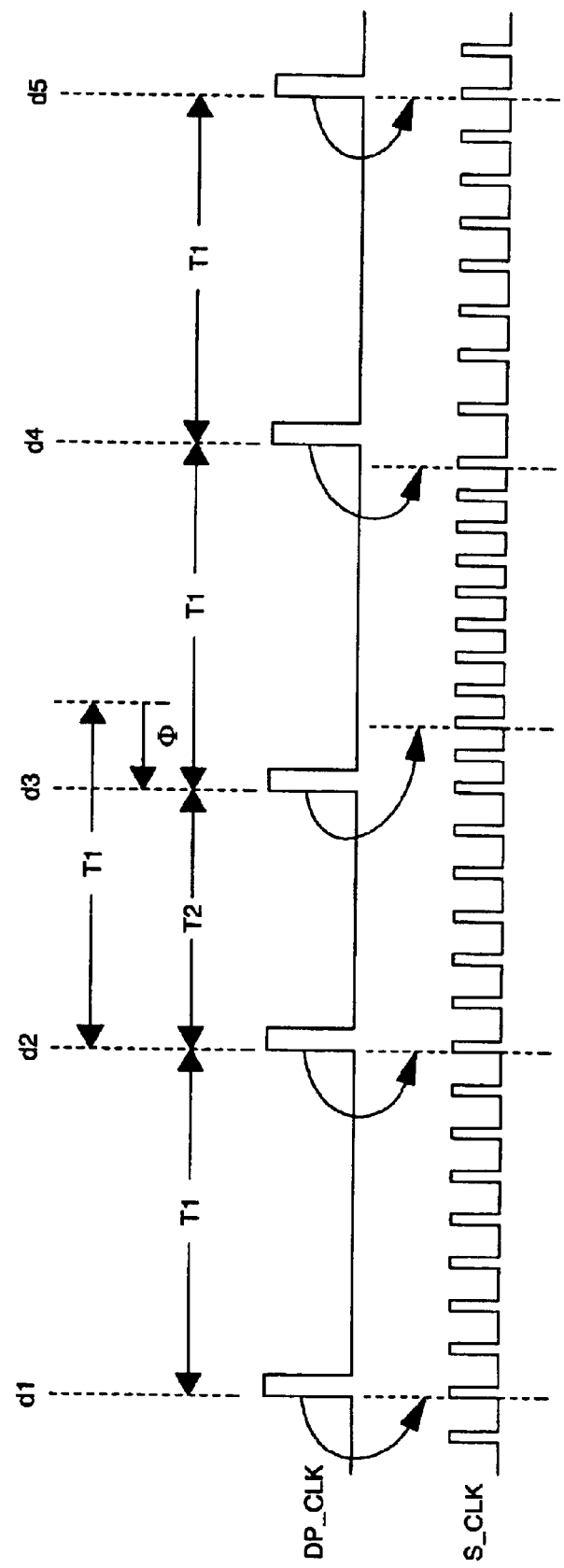
FIG. 3 is another timing chart view of a delayed parallel data clock and a serial data clock for a data delay circuit according to the present invention.

As shown in FIG. 2 the recent breakthrough of device technology makes it possible to provide such a device to smoothly align the phase of the serial parallel data clock S_CLK with that of the delayed parallel clock DP_CLK without the phase oscillating. However, there is a device that can align the phases after the phase of the serial data clock S_CLK oscillates. FIG. 3 shows an example of such a case where the phase is late with respect to DF_CLK at d3 and early at d4, but finally aligns at d5.

Referring to FIG. 2 again, the control circuit 116 changes the first control voltage CTRL 1, for example, to 1V from 2V at the time d3, and keeps the voltage. Then, the phase of the delayed parallel data clock DP_CLK keeps the phase Φ advance relative to the parallel data clock P_CLK. On the other hand, if the voltage of the first control signal CTRL 1 changes, for example, to 2V from 1V (not shown), the delayed parallel data clock DP_CLK delays by the phase Φ relative to the parallel data clock P_CLK. Further, if the voltage of the control signal CTRL 1 changes continuously like a sine wave, phases of the delayed parallel data clock DP_CLK and the serial data clock S_CLK also oscillate backward and forward repeatedly. As described above, if the phase of the delayed parallel data clock DP_CLK changes according to the voltage variation of the first control signal CTRL 1, the phase of the serial data clock S_CLK also changes in a like manner. If the phase of serial data clock S_CLK oscillates, the serial data S_DATA also oscillates, which appears as jitter. Therefore, the data delay circuit according to the present invention may make the voltages of the control signals, provided to the first delay circuit 102 and the second delay circuit 118, change according to a desired waveform in order to introduce jitter in the serial digital data signal for jitter tolerance testing. Typically, the control circuit 116 changes the voltage of the first control signal CTRL 1 that is provided to the first delay circuit 102 according to a sine wave.

Figure 4:
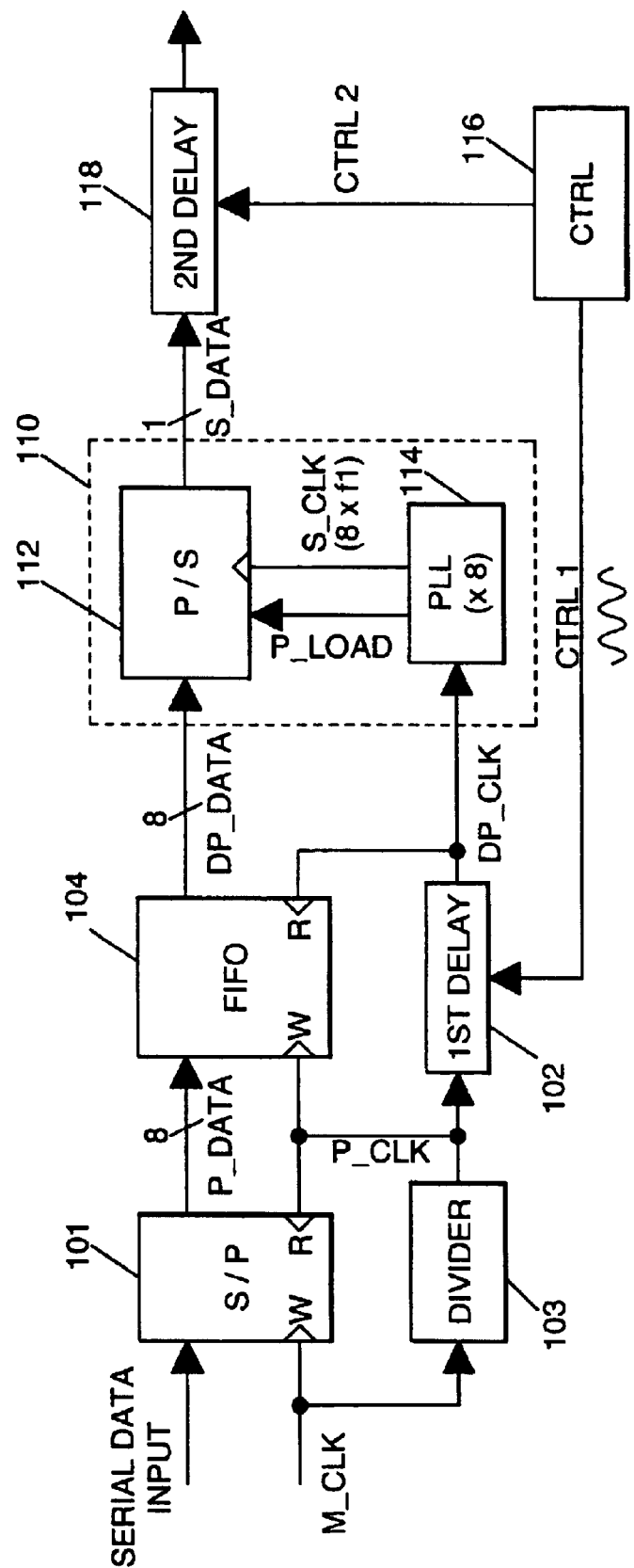
FIG. 4 is a block diagram view of a data delay circuit according to a second embodiment of the present invention.

FIG. 4 shows another embodiment according to the present invention. This case is suitable if there is an input serial digital data signal that is to be delayed instead of an already stored parallel digital data signal. Blocks corresponding to FIG. 1 have the same symbols below.

A serial-to-parallel (S/P) converter 101 receives and converts the input serial digital data signal according to a master clock M_CLK to provide an eight-bit parallel digital data signal P_DATA according to the parallel data clock P_CLK described below. The clock for reading the parallel digital data signal P_DATA from the serial-to-parallel converter 101 is not the delayed parallel data clock DP_CLK because if the frequency of the read clock is not constant, the serial-to-parallel converter 101 may not operate properly. For example, if the read clock is slow, the input serial digital data signal stored in the serial-to-parallel converter 101 might overflow with more than eight bits per clock cycle. The master clock M_CLK is a reference clock for the serial digital data signal in a normal operating digital circuit as described in the above prior art.

A divider 103 receives the master clock M_CLK to divide the frequency, in this example, by eight because the number of bits per word of the parallel digital data signal P_DATA is eight to produce the parallel data clock P_CLK. The parallel data clock P_CLK is also provided to the first delay circuit 102 and a first-in, first-out (FIFO) buffer 104. The first delay circuit 102 delays the parallel data clock P_CLK according to the first delay control signal CTRL 1 to provide the delayed parallel data clock DP_CLK. The FIFO 104 stores the parallel digital data signal P_DATA according to the parallel data clock P_CLK, and provides the delayed parallel digital data signal DP_DATA according to the delayed parallel data clock DP_CLK.

The voltage of the first control signal CTRL 1 may be changed like a sine wave, for example. This allows the phase of the delayed parallel data clock DP_CLK to advance or delay repeatedly relative to the parallel data clock P_CLK. Therefore, the phase of the delayed parallel digital data signal DP_DATA read from the FIFO 104 according the delayed parallel data clock DP_CLK also advances or delays repeatedly relative to the parallel data clock P_CLK. That is, the delayed parallel digital data signal DP_DATA includes jitter. The process of the delayed parallel data DP_DATA following the parallel-to-serial converter 112 in the conversion block 110 is similar to the first embodiment described above.

Thus a data delay circuit is provided for a serial digital data signal where the delay amount is not limited to an integral multiple of the clock period, may be any arbitrary value, and also may be continuously changed. The continuous change of the delay amount produces a serial digital data signal that includes intentional jitter for jitter tolerance testing. Because the delay of the parallel data clock (for example, the delayed parallel data clock DP_CLK in the above embodiment) is controlled with respect to a parallel digital data signal before conversion to a serial digital data signal, the input clock frequency of the delay circuit is relatively low. This allows selecting a delay device that has a low input frequency while providing a larger and more effective delay than delaying a serial digital data signal directly.

What is claimed is:

1. A circuit for variably delaying a serial data signal comprising:
   means for delaying a parallel data clock by an arbitrary amount determined by a control signal to produce a variably delayed parallel data clock, the arbitrary amount constantly changing;
   means for generating a serial data clock phase-locked to the variably delayed parallel data clock; and
   means for converting a parallel digital data signal having n-bit words to the serial data signal using the serial data clock.

2. The circuit as recited in claim 1 wherein the frequency of the serial data clock is n-times the frequency of the variably delayed parallel data clock.

3. The circuit as recited in claim 1 wherein the control signal comprises a constantly varying voltage signal so that the arbitrary amount constantly changes, resulting in the delayed serial digital data signal having jitter.

4. The circuit as recited in claim 1 further comprising means for buffering the parallel digital data signal such that the parallel digital data signal is input to the buffering means according to the parallel data clock and output from the buffering means to the converting means according to the variably delayed parallel data clock.

5. The circuit as recited in claim 4 further comprising means for converting an input serial digital data signal to the parallel digital data signal for input to the buffering means.

6. The circuit according to claim 1 further comprising means for variably delaying the serial digital data signal from the converting means by a second arbitraty amount according to a second control signal to produce a delayed serial digital data signal.

7. The circuit according to claim 6 wherein the second control signal comprises a constantly varying voltage signal so that the second arbitrary amount constantly changes.

8. A method of variably delaying a serial data signal comprising the steps of:
   delaying a parallel data clock by an arbitrary amount determined by a control signal to produce a variably delayed parallel data clock, the arbitrary amount constantly changing;
   generating a serial data clock phase-locked to the variably delayed parallel data clock; and
   converting a parallel digital data signal having n-bit words to the serial digital data signal using the serial data clock.

9. The method as recited in claim 8 wherein the frequency of the serial data clock is n-times the frequency of the variably delayed parallel data clock.

10. The method as recited in claim 8 wherein the control signal comprises a constantly varying voltage signal so that the arbitrary amount constantly changes, resulting in the delayed serial digital data signal having jitter.

11. The method as recited in claim 8 further comprising the step of buffering the parallel digital data signal such that the parallel digital data signal is input to a buffer according to the parallel data clock and output from the buffer to the converting means according to the variably delayed parallel data clock.

12. The method as recited in claim 11 further comprising the step of converting an input serial digital data signal to the parallel digital data signal for input to the buffer by the buffering step.

13. The method as recited in claim 8 further comprising the step of variably delaying the serial digital data signal from the converting means by a second arbitrary amount according to a second control signal to produce a delayed serial digital data signal.

14. The method as recited in claim 13 wherein the second control signal comprises a constantly varying voltage signal so that the second arbitrary amount constantly changes.

* * * * *